US008853092B2

(12) United States Patent
Hsieh (10) Patent No.: US 8,853,092 B2
(45) Date of Patent: Oct. 7, 2014

(54) SELF-ALIGNED PATTERNING WITH IMPLANTATION

(75) Inventor: Tzu-Yen Hsieh, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 271 days.

(21) Appl. No.: 13/341,293

(22) Filed: Dec. 30, 2011

(65) Prior Publication Data

US 2013/0171812 A1 Jul. 4, 2013

(51) Int. Cl.
*H01L 21/266* (2006.01)

(52) U.S. Cl.
USPC ..... 438/705; 438/514; 430/314; 257/E21.038

(58) Field of Classification Search
CPC .......... H01L 21/027–21/0338; H01L 21/308–21/3088; H01L 21/311–21/3115; H01L 21/32; H01L 21/467; H01L 21/469–21/47576
USPC ................. 438/510–569, 694–705, 736, 924; 430/314; 257/E21.037–E21.039
See application file for complete search history.

(56) References Cited

U.S. PATENT DOCUMENTS

| | | | | |
|---|---|---|---|---|
| 6,867,116 | B1* | 3/2005 | Chung | 438/551 |
| 7,229,928 | B2* | 6/2007 | Baier | 438/705 |
| 7,553,771 | B2* | 6/2009 | Kim et al. | 438/705 |
| 7,713,882 | B2* | 5/2010 | Huang et al. | 438/735 |
| 8,105,901 | B2* | 1/2012 | Cheng et al. | 438/268 |
| 8,222,154 | B2* | 7/2012 | Doris et al. | 438/705 |
| 8,354,331 | B2* | 1/2013 | Cheng et al. | 438/479 |
| 2009/0233448 | A1* | 9/2009 | Cho et al. | 438/705 |
| 2010/0001402 | A1* | 1/2010 | Meyer | 257/773 |
| 2010/0099253 | A1* | 4/2010 | Baier et al. | 438/666 |

OTHER PUBLICATIONS

Meishoku Masahara et al., "15-nm Thick Si Channel Wall Vertical Double-Gate MOSFET", 2002 IEEE, pp. 949-951.
Meishoku Masahara et al., "Ultrathin Channel Vertical DG MOSFET Fabricated by Using Ion-Bombardment-Retarded Etching", IEEE Transactions on Electron Devices, vol. 51, No. 12, Dec. 2004, pp. 2078-2085.
Yijian Chen, et al., "Self-Aligned Triple Patterning for Continuous IC Scaling to Half-Pitch 15nm", Optical Microlithography, XXIV, Proc. of SPIE vol. 7973, 2011, pp. 79731P-1-79731P-8.
Bencherki Mebarki et al., "Innovative Self-Aligned Triple Patterning for 1x Half Pitch Using Single 'Spacer Deposition-Spacer Etch' Step", Optical Microlithography XXIV, Proc. of SPIE vol. 7973, 2011, pp. 79730G-1-79730G-6.

* cited by examiner

*Primary Examiner* — Mark Tornow
*Assistant Examiner* — Eric Ward
(74) *Attorney, Agent, or Firm* — Haynes and Boone, LLP (57) ABSTRACT

A method of fabricating a plurality of features of a semiconductor device includes providing a dielectric layer over a silicon layer, and etching the dielectric layer and the silicon layer to form a plurality of first apertures in the dielectric layer and the silicon layer, wherein adjacent apertures of the plurality of first apertures are set apart by a first pitch. The method further includes etching a plurality of second apertures in the dielectric layer, each aperture of the plurality of second apertures having a greater width than and centered about a respective aperture of the plurality of first apertures, implanting a plurality of dopants into the silicon layer aligned through the plurality of second apertures in the dielectric layer, wherein doped portions of the silicon layer are set apart by a second pitch less than the first pitch, and removing undoped portions of the silicon layer.

19 Claims, 7 Drawing Sheets

SELF-ALIGNED PATTERNING WITH IMPLANTATION

BACKGROUND

The semiconductor industry has experienced continued rapid growth due to continuous improvements in the integration density of various electronic components (i.e., transistors, diodes, resistors, capacitors, etc.). For the most part, this improvement in integration density has come from reductions in minimum feature size, which allows more components to be integrated into a given area.

Advanced lithographic and etch processes have been used to reduce minimum feature size, but multiple patterning in mask fabrication has caused undercut issues, difficulty in controlling minimum critical dimension, and other manufacturing concerns.

SUMMARY

The present disclosure provides for many different embodiments. According to one embodiment, a method of fabricating a plurality of features is provided. The method includes providing a dielectric layer over a silicon layer, and etching the dielectric layer and the silicon layer to form a plurality of first apertures in the dielectric layer and the silicon layer, wherein adjacent apertures of the plurality of first apertures are set apart by a first pitch. The method further includes etching a plurality of second apertures in the dielectric layer, each aperture of the plurality of second apertures having a greater width than and centered about a respective aperture of the plurality of first apertures, implanting a plurality of dopants into the silicon layer aligned through the plurality of second apertures in the dielectric layer, wherein doped portions of the silicon layer are set apart by a second pitch less than the first pitch, and removing undoped portions of the silicon layer.

In yet another embodiment, a method for fabricating a plurality of features includes the elements described above and further includes etching a plurality of third apertures in the dielectric layer, each aperture of the plurality of third apertures having a greater width than and centered about a respective aperture of the plurality of second apertures, providing a patterning film over the silicon layer through the plurality of third apertures in the dielectric layer, removing the dielectric layer to expose a portion of the silicon layer through the patterning film, implanting a second plurality of dopants into the exposed silicon layer through the patterning film, wherein doped portions of the silicon layer are set apart by a second pitch less than the first pitch, and removing undoped portions of the silicon layer.

In yet another embodiment, a method for fabricating a plurality of features includes the elements described above and further includes implanting a second plurality of dopants into the exposed silicon layer through the patterning film, wherein doped portions of the silicon layer are set apart by a second pitch which is one third of the first pitch.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity. It is noted that the same or similar features may be similarly numbered herein for the sake of simplicity and clarity. In addition, some of the drawings may be simplified for clarity. Thus, the drawings may not depict all of the components of a given apparatus (e.g., device) or method.

Various aspects of the present disclosure will be described herein with reference to drawings that are schematic illustrations of idealized configurations of the present disclosure. As such, variations from the shapes of the illustrations as a result, for example, manufacturing techniques and/or tolerances, are to be expected. Thus, the various aspects of the present disclosure presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top", may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" sides of the other elements. The term "lower", can therefore, encompass both an orientation of "lower" and "upper", depending on the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items It will be understood that although the terms "first" and "second" may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present disclosure.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

Figure 1:
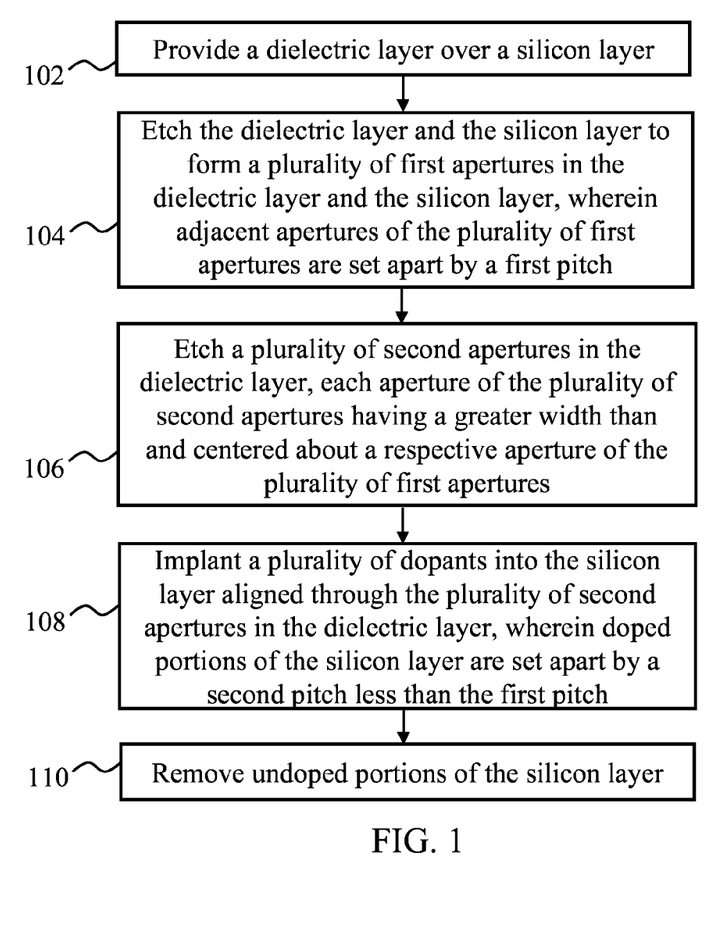
FIG. 1 is a flowchart of a method of fabricating a hard mask structure in accordance with embodiments of the present disclosure.

Referring now to FIG. 1, a flowchart is shown illustrating a method 100 for fabricating a plurality of features on a semiconductor device in accordance with an embodiment of the present disclosure. The method 100 includes providing a dielectric layer over a silicon layer at block 102, and etching the dielectric layer and the silicon layer to form a plurality of first apertures in the dielectric layer and the silicon layer at block 104, wherein adjacent apertures of the plurality of first apertures are set apart by a first pitch. Method 100 further includes etching a plurality of second apertures in the dielectric layer at block 106, each aperture of the plurality of second apertures having a greater width than and centered about a respective aperture of the plurality of first apertures, implanting a plurality of dopants into the silicon layer aligned through the plurality of second apertures in the dielectric layer at block 108, wherein doped portions of the silicon layer are set apart by a second pitch less than the first pitch, and removing undoped portions of the silicon layer at block 110.

The various structures in the method 100 described above may be formed by various deposition, pattern, and/or etch techniques. It should be noted that the operations of the method 100 may be rearranged or otherwise modified within the scope of the various aspects. It is further noted that additional processes may be provided before, during, and after the method 100, and that some other processes may only be briefly described herein. Thus, other implementations are possible with the scope of the various aspects described herein.

According to one aspect, etching of the dielectric layer and the silicon layer to form a plurality of first apertures in the dielectric layer and the silicon layer may include providing a patterned photoresist above the dielectric layer, the patterned photoresist having a plurality of apertures set apart by the first pitch, etching the dielectric layer and the silicon layer through the plurality of apertures of the patterned photoresist to form the plurality of first apertures in the dielectric layer and the silicon layer, and then removing the patterned photoresist (e.g., by ashing or etching).

According to another aspect, the silicon layer is formed as a polysilicon layer or an amorphous silicon layer. In one example, the silicon layer may be formed by depositing polysilicon or amorphous silicon, and according to one aspect, the polysilicon or amorphous silicon layer may be deposited or grown over a substrate by various means and methods, such as chemical vapor deposition (CVD), plasma enhanced CVD (PECVD), or the like.

The substrate provided below the silicon layer may include a nitride layer, and/or may include various semiconductor devices, and/or other suitable active and/or passive devices. Example semiconductor devices include integrated circuits including a metal-insulator-semiconductor field effect transistor (MOSFET) including complementary MOSFET (CMOS) features, CIS, and/or other suitable active and/or passive devices. In an embodiment, the substrate may include an integrated circuit (or portion thereof) designed and formed using a CMOS-based process. A substrate having a device (e.g., integrated circuit) formed by other semiconductor fabrication technologies is also within the scope of the described method.

In one example, the substrate may be comprised of a dielectric layer, such as a nitride layer. In other embodiments, the substrate may be comprised of other materials, such as Group III-V compounds or combinations thereof (e.g., InGaAs, InAs, GaSb, or InGaSb as channel material and AlAsSb as a buffer). In yet other embodiments, the substrate may be comprised of a material which allows for selective etching of silicon.

According to yet another aspect, undoped portions of the silicon layer may be selectively removed by applying tetramethylammonium hydroxide (TMAH), potassium hydroxide (KOH), and/or ammonium to the doped and undoped portions of the silicon layer.

According to yet another aspect, method 100 may further include etching a plurality of third apertures in the dielectric layer, each aperture of the plurality of third apertures having a greater width than and centered about a respective aperture of the plurality of second apertures, providing a patterning film over the silicon layer through the plurality of third apertures in the dielectric layer, removing the dielectric layer to expose a portion of the silicon layer through the patterning film, and implanting the exposed silicon layer through the patterning film.

According to yet another aspect, method 100 may further include removing the patterning film by ashing, and removing undoped portions of the silicon layer by TMAH to provide doped portions of the silicon layer set apart by the second pitch.

According to yet another aspect, the patterning film may be provided as a photoresist layer or an advanced patterning film (APF), such as that described in U.S. application Ser. No.

11/778,239 (US2009/0023294), the disclosure of which is incorporated by reference herein for all purposes.

Referring now to FIGS. 2A-2L, cross-sectional views of a hard mask 200 at various stages of fabrication are illustrated in accordance with embodiments of the present disclosure.

Figure 2A:
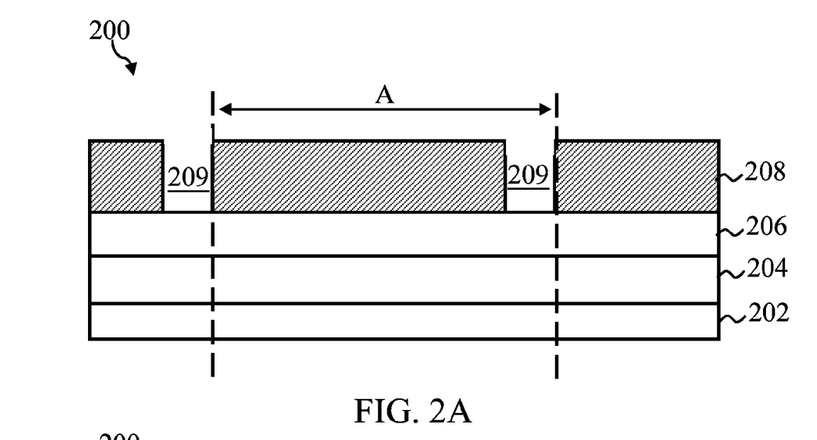
FIGS. 2A-2L are cross-sectional views of a hard mask structure at various stages of fabrication in accordance with embodiments of the present disclosure.

FIG. 2A illustrates a silicon layer 204 disposed over a substrate 202, a dielectric layer 206 disposed over the silicon layer 204, and a photoresist 208 disposed over dielectric layer 206. Photoresist 208 is patterned to have a plurality of apertures 209 set apart by a first pitch A. Photoresist 208 may be patterned by applicable lithography, exposure, and etch means and methods as known in the art. In one example, dielectric layer 206 may be comprised of silicon oxide.

According to one aspect, substrate 202 provided below the silicon layer 204 may include a nitride layer, and/or may include various semiconductor devices, and/or other suitable active and/or passive devices. Example semiconductor devices include integrated circuits including a metal-insulator-semiconductor field effect transistor (MOSFET) including complementary MOSFET (CMOS) features, CIS, and/or other suitable active and/or passive devices. In an embodiment, the substrate 202 may include an integrated circuit (or portion thereof) designed and formed using a CMOS-based process. A substrate having a device (e.g., integrated circuit) formed by other semiconductor fabrication technologies is also within the scope of the described method.

In one example, the substrate 202 may be comprised of a dielectric layer, such as a nitride layer. In other embodiments, the substrate 202 may be comprised of other materials, such as Group III-V compounds or combinations thereof (e.g., InGaAs, InAs, GaSb, or InGaSb as channel material and AlAsSb as a buffer). In yet other embodiments, the substrate 202 may be comprised of a material which allows for selective etching of silicon.

In one example, the silicon layer 204 is formed as a polysilicon layer or an amorphous silicon layer. In one example, silicon layer 204 may be formed by selective epitaxial growth in any suitable epitaxial deposition system and process, such as chemical vapor deposition (CVD), plasma enhanced CVD (PECVD), metal-organic chemical vapor deposition (MOCVD), atmospheric pressure CVD (APCVD), low- (or reduced-) pressure CVD (LPCVD), ultra-high vacuum CVD (UHVCVD), molecular beam epitaxy (MBE), atomic layer deposition (ALD), or molecular layer deposition (MLD). In another example, silicon layer 204 may be deposited as an amorphous layer using silane ($SiH_4$) or disilane ($Si_2H_6$) in any suitable deposition system and process, such as chemical vapor deposition (CVD) or plasma enhanced CVD (PECVD). In one example, an undoped polysilicon layer may be deposited (e.g., via LPCVD procedures), and conventional photolithographic and anisotropic RIE procedures (e.g., using $Cl_2$ or $SF_6$ as an etchant) may be used to define silicon layer 204.

Figure 2B:
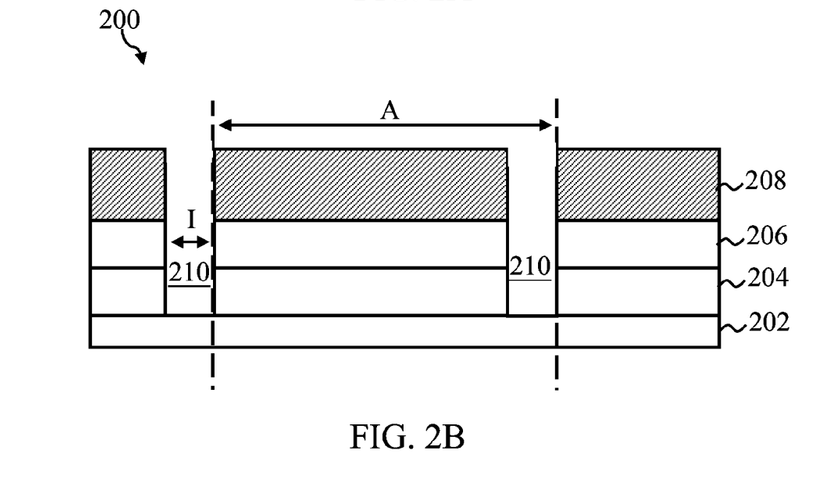

FIG. 2B illustrates an etch of the dielectric layer 206 and the silicon layer 204 through the plurality of apertures 209 of the patterned photoresist 208 to form a plurality of first apertures 210 in the dielectric layer 206 and the silicon layer 204. Adjacent apertures of the plurality of first apertures 210 are set apart by first pitch A, and each first aperture 210 has a first width I. In one example, an oxide etcher with a fluorinated etchant gas may be used in conjunction with the patterned photoresist. In another example, an anisotropic reactive ion etch (RIE) procedure (e.g., using $Cl_2$ or $SF_6$ as an etchant) may be used.

Figure 2C:
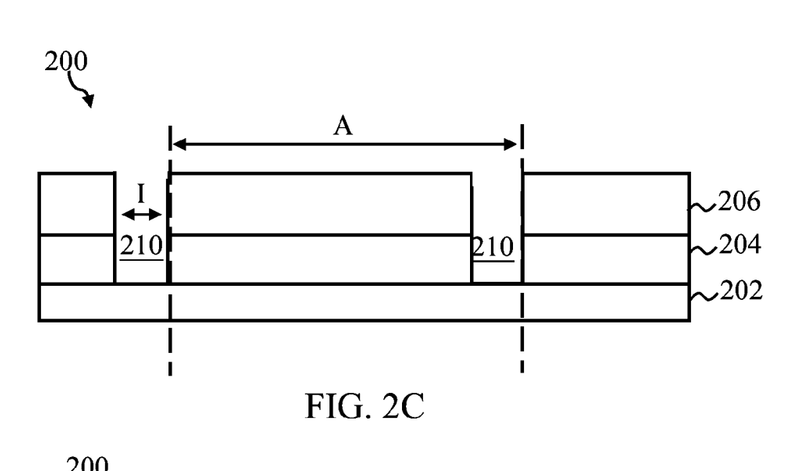

FIG. 2C illustrates removal of the patterned photoresist 208. Photoresist 208 may be removed by an applicable removal means and method as known in the art, such as by plasma oxygen ashing.

Figure 2D:
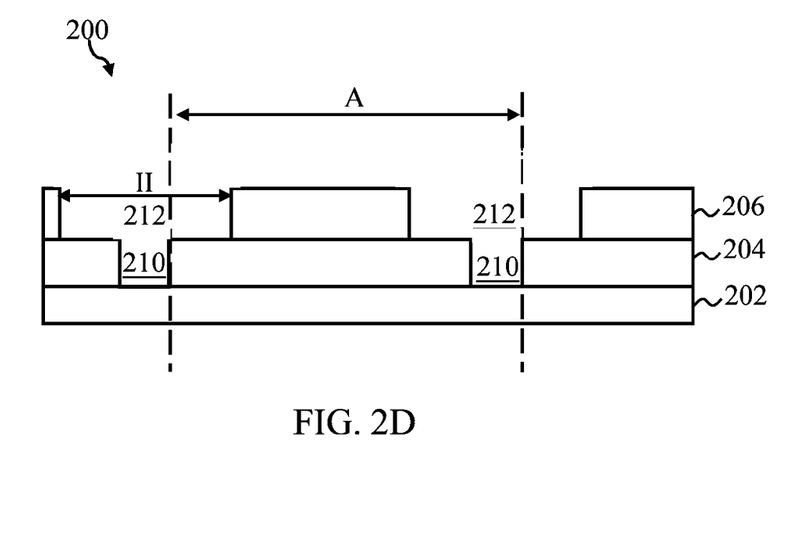

FIG. 2D illustrates etching of a plurality of second apertures 212 in the dielectric layer 206. Each aperture of the plurality of second apertures 212 has a second width II, which is greater than and centered about a respective aperture of the plurality of first apertures 210. In other words, second aperture 212 has a second width II which is greater than first width I of first aperture 210. In one embodiment, second width II is three times the width of first width I. Second apertures 212 may be patterned by applicable photolithography, exposure, and etch means and methods as known in the art. Various etch techniques, such as dry and/or wet etch techniques may be used to etch dielectric layer 206 to form second apertures 212. In one example, dilute HF may be used for a wet etch of dielectric layer 206. In another example, an oxide etcher with a fluorinated etchant gas may be used in conjunction with a patterned photoresist. In another example, an anisotropic RIE procedure (e.g., using $Cl_2$ or $SF_6$ as an etchant) may be used.

Figure 2E:
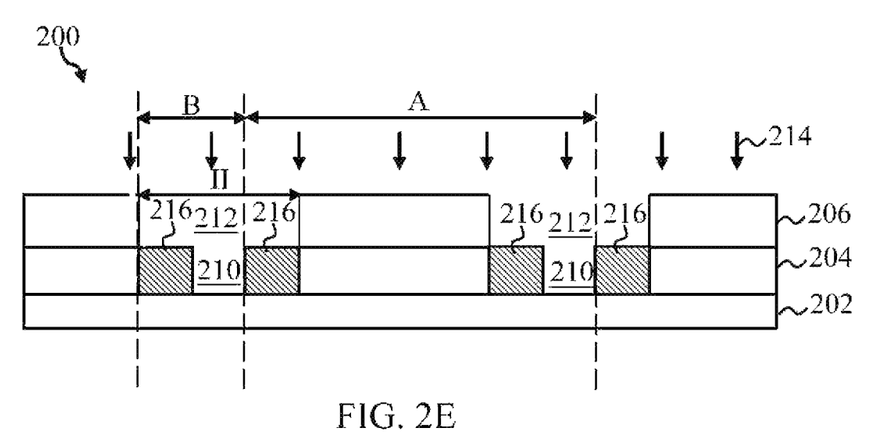

FIG. 2E illustrates implanting the silicon layer 204 aligned through the plurality of second apertures 212 in the dielectric layer 206 to form doped portions 216 of the silicon layer 204. In one embodiment, doped portions 216 of the silicon layer 204 are set apart by a second pitch B which is less than the first pitch A. According to one aspect of the present disclosure, second pitch B is one third of the first pitch A.

Formation of doped portions 216 may be accomplished utilizing an ion implantation procedure performed using p-type dopants or n-type dopants. In one example, p-type dopants, such as boron ions, may be applied. In other cases, n-type implantation, such as arsenic or phosphorous ions, may be performed. Additional examples of dopants which may be used, include but are not limited to $BF_2$, Ge, C, N, and He. Additional ion implantation procedures can be used, and various species and doses may be used.

Figure 2F:
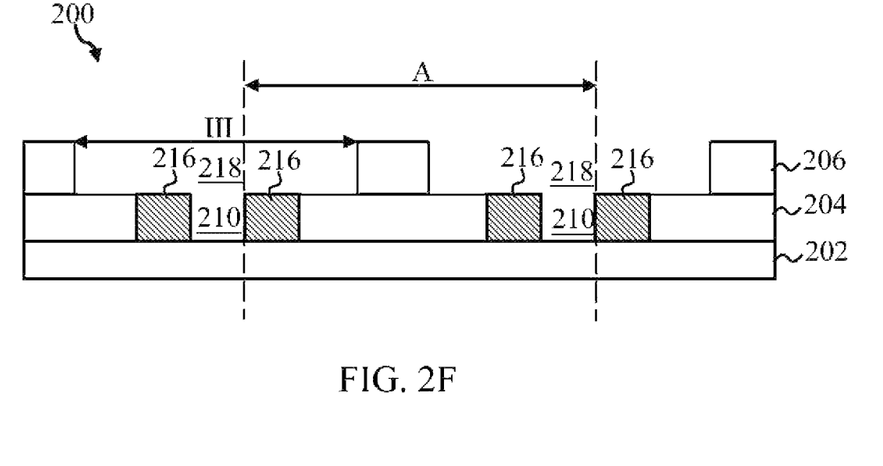

FIG. 2F illustrates etching of a plurality of third apertures 218 in the dielectric layer 206. Each aperture of the plurality of third apertures 218 has a third width III, which is greater than and centered about a respective aperture of the plurality of second apertures 212 or first apertures 210. In other words, third aperture 218 has a third width III which is greater than second width II of second aperture 212. In one embodiment, third width III is five times the width of first width I. Third apertures 218 may be patterned by applicable lithography, exposure, and etch means and methods as known in the art. Various etch techniques, such as dry and/or wet etch techniques may be used to etch dielectric layer 206 to form third apertures 218. In one example, dilute HF may be used for a wet etch of dielectric layer 218. In another example, an oxide etcher with a fluorinated etchant gas may be used in conjunction with a patterned photoresist. In another example, an anisotropic RIE procedure (e.g., using $Cl_2$ or $SF_6$ as an etchant) may be used.

Figure 2G:
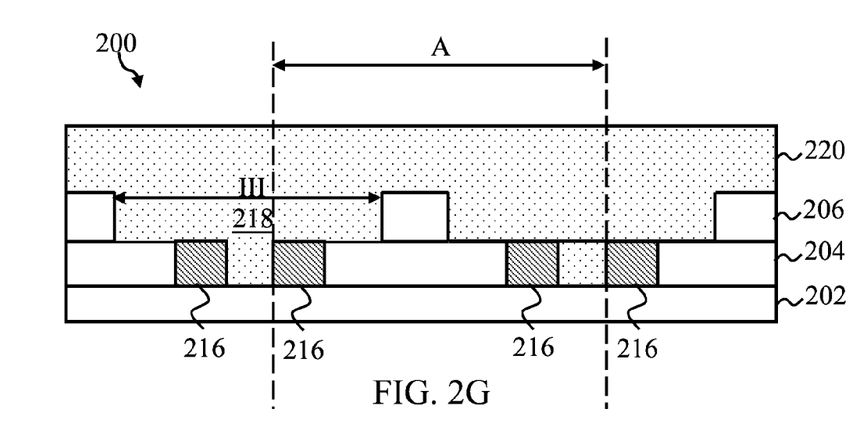

FIG. 2G illustrates providing a patterning film 220 over the silicon layer 204 through the plurality of third apertures 218 in the dielectric layer 206. In one example, the patterning film 220 is provided as a photoresist layer or an advanced patterning film (APF). An APF is disclosed in U.S. application Ser. No. 11/778,239 (US2009/0023294), the disclosure of which has incorporated by reference herein for all purposes.

Figure 2H:
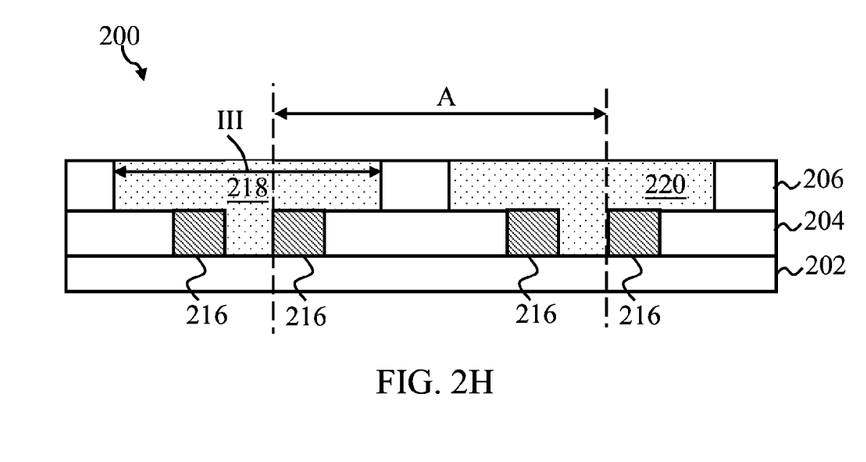

FIG. 2H illustrates planarizing the patterning film 220 to expose dielectric layer 206. In one example, a chemical mechanical polishing (CMP) procedure may be employed to remove portions of the patterning film until dielectric layer 206 is exposed.

Figure 2I:
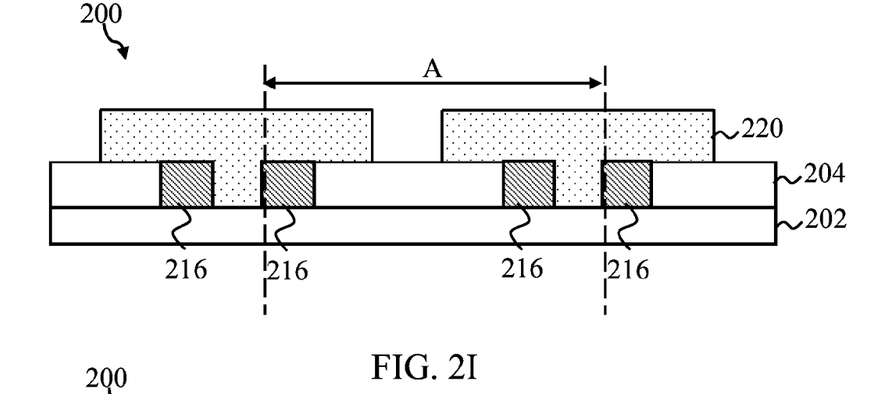

FIG. 2I illustrates removing of the dielectric layer 206 to expose an undoped portion of silicon layer 204 through the patterning film 220.

Figure 2J:
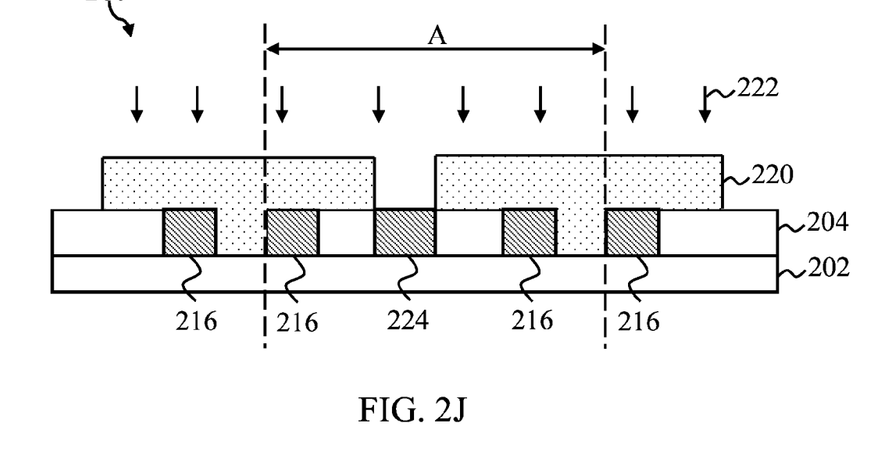

FIG. 2J illustrates implanting the exposed undoped silicon layer 204 through the patterning film 220 to form doped portions 224 of the silicon layer 204. In one embodiment, adjacent doped portions 216 and 224 of silicon layer 204 are set apart by second pitch B which is less than first pitch A. According to one aspect of the present disclosure, second pitch B is one third of the first pitch A.

Formation of doped portions 224 may be accomplished utilizing an ion implantation procedure performed using p-type dopants or n-type dopants. In one example, p-type dopants, such as boron ions, may be applied. In other cases, n-type implantation, such as arsenic or phosphorous ions, may be performed. Additional examples of dopants which may be used, include but are not limited to $BF_2$, Ge, C, N, and He. Additional ion implantation procedures can be used, and various species and doses may be used.

Figure 2K:
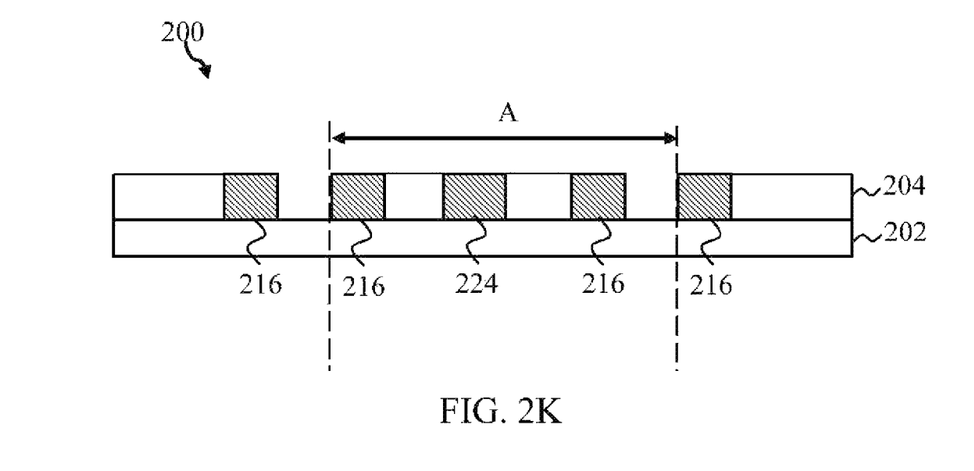

FIG. 2K illustrates removing of the patterning film 220, which can be accomplished by applicable removal means and methods, such as by plasma oxide ashing in one example.

Figure 2L:
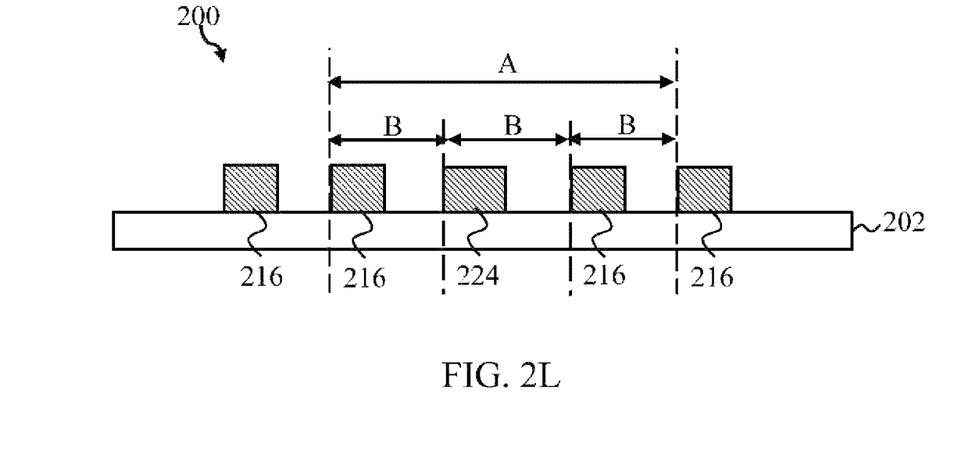

FIG. 2L illustrates removing of undoped portions of the silicon layer 204 to provide remaining doped portions 216 and 224 of the silicon layer, with adjacent doped portions 216 and/or 224 being set apart by second pitch B. In one example, undoped portions of the silicon layer 204 may be selectively removed by applying TMAH, KOH, or ammonium to silicon layer 204. Advantageously, a slow etch rate for the selective etch of undoped portions of the silicon layer may reduce under layer recessing or undercutting.

In one example, second pitch B is less than first pitch A, and in another example is about one third of first pitch A. In yet another example, A is between about 90 nanometers and about 180 nanometers, and in another example, is less than about 90 nanometers. In another example, B is between about 30 nanometers and about 60 nanometers, and in another example, is less than about 30 nanometers.

Advantageously, the transistor devices and fabrication methods described above may be easily integrated with standard CMOS processes. Furthermore, the present disclosure allows for advantages resulting from the implantation nature of the processing, such as substantially no global pattern density loading effect, improved process yield since small particles may not affect yield if implantation can penetrate the particle defect, substantially no CD bias between dense and isolated patterns, and precise target CD definition by implantation through photoresist edges and silicon hard mask edges. Over-implantation will not change the target CD. Furthermore, the present disclosure minimizes (1) wafer topography and (2) line and space CD mismatch.

Thus, the present disclosure provides for various advantageous embodiments. In one embodiment, a method of fabricating a plurality of features is provided. The method includes providing a dielectric layer over a silicon layer, and etching the dielectric layer and the silicon layer to form a plurality of first apertures in the dielectric layer and the silicon layer, wherein adjacent apertures of the plurality of first apertures are set apart by a first pitch. The method further includes etching a plurality of second apertures in the dielectric layer, each aperture of the plurality of second apertures having a greater width than and centered about a respective aperture of the plurality of first apertures, implanting a plurality of dopants into the silicon layer aligned through the plurality of second apertures in the dielectric layer, wherein doped portions of the silicon layer are set apart by a second pitch less than the first pitch, and removing undoped portions of the silicon layer.

In yet another embodiment, a method for fabricating a plurality of features includes the elements described above and further includes etching a plurality of third apertures in the dielectric layer, each aperture of the plurality of third apertures having a greater width than and centered about a respective aperture of the plurality of second apertures, providing a patterning film over the silicon layer through the plurality of third apertures in the dielectric layer, removing the dielectric layer to expose a portion of the silicon layer through the patterning film, implanting a second plurality of dopants into the exposed silicon layer through the patterning film, wherein doped portions of the silicon layer are set apart by a second pitch less than the first pitch, and removing undoped portions of the silicon layer.

In yet another embodiment, a method for fabricating a plurality of features includes the elements described above and further includes implanting a second plurality of dopants into the exposed silicon layer through the patterning film, wherein doped portions of the silicon layer are set apart by a second pitch which is one third of the first pitch.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method of fabricating a plurality of features, the method comprising:
   forming a dielectric layer over a silicon layer;
   etching the dielectric layer and the silicon layer to form a plurality of first apertures in the dielectric layer and the silicon layer, wherein adjacent apertures of the plurality of first apertures are set apart by a first pitch;
   etching a plurality of second apertures in the dielectric layer, each aperture of the plurality of second apertures having a greater width than and centered about a respective aperture of the plurality of first apertures;
   implanting a plurality of dopants into the silicon layer aligned through the plurality of second apertures in the dielectric layer, wherein doped portions of the silicon layer are set apart by a second pitch less than the first pitch;
   etching a plurality of third apertures in the dielectric layer, each aperture of the plurality of third apertures having a greater width than and centered about a respective aperture of the plurality of second apertures;
   providing a patterning film over the silicon layer through the plurality of third apertures in the dielectric layer;
   removing the dielectric layer to expose a portion of the silicon layer through the patterning film;
   implanting the exposed silicon layer through the patterning film; and
   removing undoped portions of the silicon layer.

2. The method of claim 1, wherein the silicon layer is formed as a polysilicon layer or an amorphous silicon layer.

3. The method of claim 1, wherein undoped portions of the silicon layer are removed by applying TMAH, KOH, or ammonium.

4. The method of claim 1, further comprising:
   providing a patterned photoresist above the dielectric layer, the patterned photoresist having a plurality of apertures set apart by the first pitch;
   etching the dielectric layer and the silicon layer through the plurality of apertures of the patterned photoresist to form the plurality of first apertures in the dielectric layer and the silicon layer; and
   removing the patterned photoresist.

5. The method of claim 1, further comprising providing a nitride layer below the silicon layer.

6. The method of claim 1, further comprising:
removing the patterning film by ashing; and
removing undoped portions of the silicon layer by TMAH to provide doped portions of the silicon layer set apart by the second pitch.

7. The method of claim 1, wherein the patterning film is provided as a photoresist layer or an advanced patterning film (APF).

8. A method of fabricating a plurality of features, the method comprising:
providing a dielectric layer over a silicon layer;
etching the dielectric layer and the silicon layer to form a plurality of first apertures in the dielectric layer and the silicon layer, wherein adjacent apertures of the plurality of first apertures are set apart by a first pitch;
etching a plurality of second apertures in the dielectric layer, each aperture of the plurality of second apertures having a greater width than and centered about a respective aperture of the plurality of first apertures;
implanting a first plurality of dopants into the silicon layer aligned through the plurality of second apertures in the dielectric layer;
etching a plurality of third apertures in the dielectric layer, each aperture of the plurality of third apertures having a greater width than and centered about a respective aperture of the plurality of second apertures;
providing a patterning film over the silicon layer through the plurality of third apertures in the dielectric layer;
removing the dielectric layer to expose a portion of the silicon layer through the patterning film;
implanting a second plurality of dopants into the exposed silicon layer through the patterning film, wherein doped portions of the silicon layer are set apart by a second pitch less than the first pitch; and
removing undoped portions of the silicon layer.

9. The method of claim 8, wherein the silicon layer is formed as a polysilicon layer or an amorphous silicon layer.

10. The method of claim 8, wherein the patterning film is provided as a photoresist layer or an advanced patterning film (APF).

11. The method of claim 8, wherein undoped portions of the silicon layer are removed by applying TMAH, KOH, or ammonium.

12. The method of claim 8, further comprising:
providing a patterned photoresist above the dielectric layer, the patterned photoresist having a plurality of apertures set apart by the first pitch;
etching the dielectric layer and the silicon layer through the plurality of apertures of the patterned photoresist to form the plurality of first apertures in the dielectric layer and the silicon layer; and
removing the patterned photoresist.

13. The method of claim 8, further comprising providing a nitride layer below the silicon layer.

14. The method of claim 8, further comprising:
removing the patterning film by ashing; and
removing undoped portions of the silicon layer by TMAH to provide doped portions of the silicon layer set apart by the second pitch.

15. A method of fabricating a plurality of features, the method comprising:
providing a dielectric layer over a silicon layer;
etching the dielectric layer and the silicon layer to form a plurality of first apertures in the dielectric layer and the silicon layer, wherein adjacent apertures of the plurality of first apertures are set apart by a first pitch;
etching a plurality of second apertures in the dielectric layer, each aperture of the plurality of second apertures having a greater width than and centered about a respective aperture of the plurality of first apertures;
implanting a first plurality of dopants into the silicon layer aligned through the plurality of second apertures in the dielectric layer;
etching a plurality of third apertures in the dielectric layer, each aperture of the plurality of third apertures having a greater width than and centered about a respective aperture of the plurality of second apertures;
providing a patterning film over the silicon layer through the plurality of third apertures in the dielectric layer;
removing the dielectric layer to expose a portion of the silicon layer through the patterning film;
implanting a second plurality of dopants into the exposed silicon layer through the patterning film, wherein doped portions of the silicon layer are set apart by a second pitch which is one third of the first pitch;
removing the patterning film; and
removing undoped portions of the silicon layer.

16. The method of claim 15, wherein the silicon layer is formed as a polysilicon layer or an amorphous silicon layer.

17. The method of claim 15, wherein the patterning film is provided as a photoresist layer or an advanced patterning film (APF).

18. The method of claim 15, wherein undoped portions of the silicon layer are removed by applying TMAH, KOH, or ammonium.

19. The method of claim 15, further comprising:
providing a patterned photoresist above the dielectric layer, the patterned photoresist having a plurality of apertures set apart by the first pitch;
etching the dielectric layer and the silicon layer through the plurality of apertures of the patterned photoresist to form the first plurality of apertures in the dielectric layer and the silicon layer; and
removing the patterned photoresist.

* * * * *